United States Patent
Zhang et al.

(10) Patent No.: US 6,897,074 B1
(45) Date of Patent: May 24, 2005

(54) METHOD FOR MAKING SINGLE-PHASE C-AXIS DOPED PGO FERROELECTRIC THIN FILMS

(75) Inventors: Fengyan Zhang, Vancouver, WA (US); Wei-Wei Zhuang, Vancouver, WA (US); Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/794,736

(22) Filed: Mar. 3, 2004

(51) Int. Cl.$^7$ ............................................. H01L 21/00
(52) U.S. Cl. ........................................................ 438/3
(58) Field of Search ........................... 438/3, 386, 387, 438/393, 396

(56) References Cited

U.S. PATENT DOCUMENTS 4,109,359 A * 8/1978 Cross et al. ............... 29/25.35

* cited by examiner

*Primary Examiner*—Eddie Lee
*Assistant Examiner*—Douglas W. Owens
(74) *Attorney, Agent, or Firm*—David C. Ripma; Matthew D. Rabdau; Joseph P. Curtin

(57) ABSTRACT

A method for forming a doped PGO ferroelectric thin film, and related doped PGO thin film structures are described. The method comprising: forming either an electrically conductive or electrically insulating substrate; forming a doped PGO film overlying the substrate; annealing; crystallizing; and, forming a single-phase c-axis doped PGO thin film overlying the substrate, having a Curie temperature of greater than 200 degrees C. Forming a doped PGO film overlying the substrate includes depositing a doped precursor in the range between 0.1N and 0.5N, with a molecular formula of $Pb_{y-x}M_xGe_3O_{11}$, where: M is a doping element; y=4.5 to 6; and, x=0.1 to 1. The element M can be Sn, Ba, Sr, Cd, Ca, Pr, Ho, La, Sb, Zr, or Sm.

14 Claims, 3 Drawing Sheets

METHOD FOR MAKING SINGLE-PHASE C-AXIS DOPED PGO FERROELECTRIC THIN FILMS

BACKGROUND OF THE INVENTION

1. Field of the Invention

This invention generally relates to integrated circuit (IC) ferroelectric thin film processes and, more particularly, to a doped PGO thin film, and corresponding fabrication processes.

2. Description of the Related Art

Ferroelectric-gate controlled devices, such as metal-ferroelectric-silicon field-effect transistor (MFS FET), were studied as early as the 1950s. In recent years, ferroelectric-gate controlled memory transistors have attracted much attention for high-density nonvolatile memory applications. Two kinds of device structures, Metal-Ferroelectric-Insulator-Silicon (MFIS) FET and Metal-Ferroelectric-Metal-OxideSilicon (MFMOS) FET, have been fabricated thus far. The ferroelectric $Pb_3Ge_5O_{11}$ (PGO) thin films have a smaller polarization, a relatively large coercive field, and a lower dielectric constant. Therefore, PGO is a prime candidate for one-transistor memory applications. Extremely high c-axis oriented PGO thin films can be deposited on Pt and Ir metals, and working 1T-memory devices with PGO MFMOS memory cells have been fabricated. Even so, high quality 1T devices with good retention properties have been found to be difficult to fabricate. The problems result from the poor quality of the ferroelectric thin films, the leakage current of 1T devices, and the trapped charges in ferroelectric and oxide capacitors. These integration-induced damages are largely the result of PGO etching processes.

PGO is a ferroelectric material with low dielectric constant of about 50. This material is a low-symmetry ferroelectric material. Its spontaneous polarization exists only along one axis (c-axis) and has a value of 4–6 micro-Coulombs per square centimeter ($\mu C/cm^2$). Conventionally, the Curie temperature of PGO is about 177° C.

Pure c-axis oriented PGO thin films have been successfully grow on Ir, Pt, Pt/Ir, and Ir—Ta—O conductive electrodes, as well as on $ZrO_2$, $HfO_2$, Zr—Hf—O, Zr—Al—O, Hf—Al—O insulators, using a spin on method. The resultant structures can be used for MFMOS and MFIS single transistor memory applications.

The Curie temperature of conventional PGO thin films is relatively low, causing thermal stability concerns. Once the working temperature exceeds 120° C., large leakage currents are typically observed. As a result of the low Curie temperature PGO film, the thermal stability of MFMOS and MFIS structures, formed from such a film, is impacted.

It has been reported that doping can modify the properties of ferroelectric thin films, but very little research has been performed on the subject of PGO thin film doping. This is because the ferroelectric $Pb_5Ge_3O_{11}$ phase has a particularly narrow growth window.

It would be advantageous if the PGO thin film properties relating to the Curie temperature could be modified.

It would be advantageous if the Curie temperature properties of PGO thin films could be modified by doping the PGO film. It would be advantageous if ferroelectric capacitors, suitable for use in 1T memory applications, could be fabricated using a PGO thin film having a higher Curie temperature.

SUMMARY OF THE INVENTION

The present invention describes a doped PGO thin film, and a corresponding deposition process to form single-phase c-axis doped PGO thin films. For example, a Sn-doped PGO (PSGO) film is described. More specifically, the deposition conditions associated with using spin on method are explained.

Accordingly, a method is provided for forming a doped PGO ferroelectric thin film. The method comprising: forming either an electrically conductive or electrically insulating substrate; forming a doped PGO film overlying the substrate; annealing; crystallizing; and, forming a single-phase c-axis doped PGO thin film overlying the substrate, having a Curie temperature of greater than 200 degrees C.

Forming a doped PGO film overlying the substrate includes depositing a doped precursor in the range between 0.1N and 0.5N, with a molecular formula of $Pb_{y-x}M_xGe_3O_{11}$ where:

M is a doping element;

y = 4.5 to 6; and,
x = 0.1 to 1.

The element M can be Sn, Ba, Sr, Cd, Ca, Pr, Ho, La, Sb, Zr, or Sm. More specifically, the doped PGO film is formed by: spin-coating the precursor at a spin speed in the range between 500 and 10,000 revolution per minute (rpm); and, baking.

The method also describes details in the preparation of a Sn-doped PGO precursor, and process details associated with the preparation of a Sn-doped PGO thin film. Additional details of the above-described method, a doped PGO film structure, and a doped PGO capacitor are provided below.

DETAILED DESCRIPTION

Figure 1:
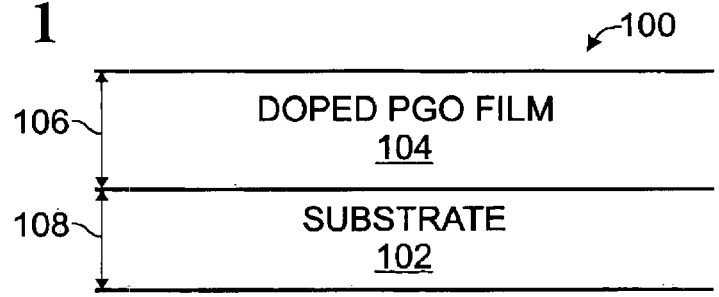
FIG. 1 is a partial cross-sectional view of the present invention single-phase c-axis doped $Pb_5Ge_3O_{11}$ (PGO) ferroelectric thin film structure.

OF THE PREFERRED EMBODIMENTS FIG. 1 is a partial cross-sectional view of the present invention single-phase c-axis doped $Pb_5Ge_3O_{11}$ (PGO) ferroelectric thin film structure. The structure 100 comprises a substrate 102 and a doped PGO thin film 104 overlying the substrate 102. The doped PGO film 104 has a Curie temperature of greater than 200 degrees C. In some aspects, the doped PGO thin film 104 has a thickness 106 in the range of 10 to 300 nanometers (nm).

The substrate 102 can be either an electrically conductive or an electrically insulating substrate. If conductive, the substrate can be a material such as Ir, Pt, Pt/Ir, or Ir—Ta—O. If electrically insulating, the substrate can be ZrO2, HfO2, Zr—Hf—O, Zr—Al—O, or Hf—Al—O. The above-mentioned materials are conventionally used in many IC fabrication processes. Other, less conventional materials may also be used as substrate materials. The present invention is not necessarily limited to just the listed materials.

The doped PGO thin film 104 has a molecular formula of $Pb_{y-x}M_xGe_3O_{11}$, where:

M is a doping element;

$y = 4.5$ to $6$; and,
$x = 0.1$ to $1$.

The element M may be Sn, Ba, Sr, Cd, Ca, Pr, Ho, La, Sb, Zr, or Sm, to name a few examples. However, the present invention film structure is not necessarily limited to just these materials.

With respect to Sn doping, a Sn-doped PGO thin film 104 has an atomic ratio of Pb:Sn:Ge=5.1:0.4:3. If the substrate 102 is an electrically conductive film having thickness 108 of about 100 nm, then the Sn-doped PGO film has a dielectric constant in the range of 40 to 50. Note, the dielectric constant is measured with the aid of a top electrode (not shown). As used herein, the term "about" is intended to represent conventional IC fabrication process tolerances.

Figure 2:
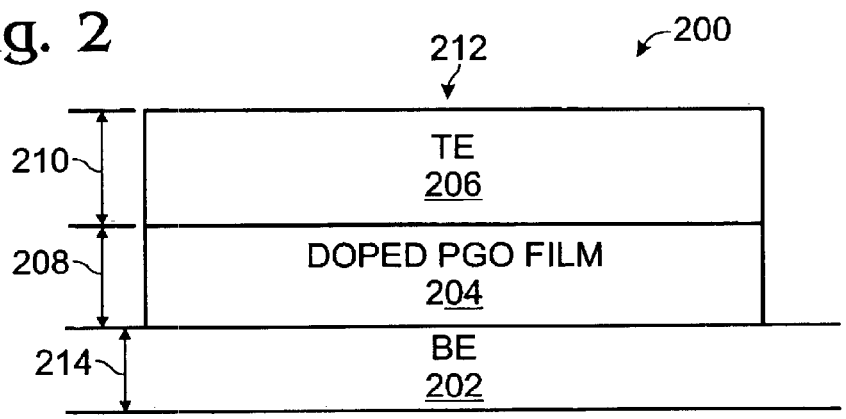
FIG. 2 is a partial cross-sectional view of the present invention single-phase c-axis doped PGO ferroelectric capacitor.

FIG. 2 is a partial cross-sectional view of the present invention single-phase c-axis doped PGO ferroelectric capacitor. The capacitor 200 comprises a bottom electrode (BE) 202 and a single-phase c-axis doped PGO ferroelectric thin film 204 overlying the bottom electrode 202. The doped PGO film 204 has a Curie temperature of greater than 200 degrees C. A top electrode (TE) 206 overlies the doped PGO thin film 204. In some aspects, the doped PGO thin film 204 has a thickness 208 in the range of 10 to 300 nanometers (nm).

The top and bottom electrodes 206/202 are a material such as Ir, Pt, Pt/Ir, or Ir—Ta—O. Note, this is not an exhaustive list of every possible material. Further, the top electrode 206 need not necessarily be made from the same material as the bottom electrode 202. The doped PGO thin film 204 has a molecular formula of $Pb_{y-x}M_xGe_3O_{11}$, where:

M is a doping element;

$y = 4.5$ to $6$; and,
$x = 0.1$ to $1$.

Element M can be Sn, Ba, Sr, Cd, Ca, Pr, Ho, La, Sb, Zr, or Sm. However, the present invention is not necessarily limited to just this list of materials.

The capacitor 200 has a 2Pr of about 4 to 8 micro-Coulombs/cm². The capacitor 200 has a hysteresis loop that is about 80% saturated at +/−3 volts. With M=Sn, the Sn-doped PGO thin film 204 has an atomic ratio of Pb:Sn:Ge=5.1:0.4:3.

In some aspects, the top electrode 206 has a thickness 210 of about 100 nm, and the bottom electrode 202 has a thickness 214 of about 100 nm. Then, the Sn-doped PGO thin film 204 has a dielectric constant in the range of 40 to 50.

FUNCTIONAL DESCRIPTION

As a demonstration of the present invention, a Sn-doped PGO films deposition process is described, using a spin on method, for deposition on both Ir and $ZrO_2$ substrates. The precursors are lead acetate trihydrate, germanium isopropoxide and Tin 2-ethylhexanoic acid in di (ethylene glycol) ethyl ether solution, heat treated at 140–190° C. for 1–2 hours, and finally purified through a 0.2 $\mu$m (micron) filter. The concentration of the precursor is at 0.1N to 0.5N and the molecular formula is $Pb_{y-x}Sn_xGe_3O_{11}$, $y=4.5\sim6$ and $x=0.1\sim1$. Then, the solution is spin coated on the substrates at 1000–10000 rpm, preferred at 1500–5000 rpm. After spin-coating, the film is baked in air at 50–450° C., more preferable at 150–350° C., for 1 to 10 minutes (min) to evaporate the solvent and eliminate the organic components. The film is rapid thermal annealed (RTA'd) in an oxygen atmosphere at 450–550° C., for 1–30 minutes. The thickness of the each spin-coating layer is about 10 nm to 100 nm. These steps are repeated several times to obtain the required thickness. Then, the PGO thin film is finally crystallized at 500–600° C., for 15–360 min, in oxygen ambient. In another example, the precursor is lead acetate trihydrate, germanium isopropoxide and Tin 2-ethylhexanoic acid in di (ethylene glycol) ethyl ether solution. The precursor is heat treated at 140–190° C. for 1–2 hours and purified through a 0.2 $\mu$m filter with 0.5 N concentration. The atomic ratio of each element in the precursor is Pb:Sn:Ge=5.1:0.4:3. The spin speed is 2500–4000 rpm. The baking condition is 200° C. for 1–5 min in air. The RTA annealing condition after each layer is 500–550° C., for 1–15 min, in oxygen atmosphere. The final RTA annealing condition is 500–600° C., for 5–60 min, in an oxygen atmosphere. The thickness of the PGO thin film is 150 nm. After PGO deposition, the Pt top electrode is deposited by e-beam evaporation using a shallow mask. The thickness of the Pt film is about 100 nm with an area about $5\times10^{-4}$ cm². XRD (X-ray diffraction) was used to characterize the phases of PGO thin film. The hysteresis loops were measured on a standard RT66 system. The CV (capacitance-voltage) characteristics of a Ir/PGO/Ir capacitor were measured at 100 KHz on a Keithley 590 CV analyzer.

Figure 3A:
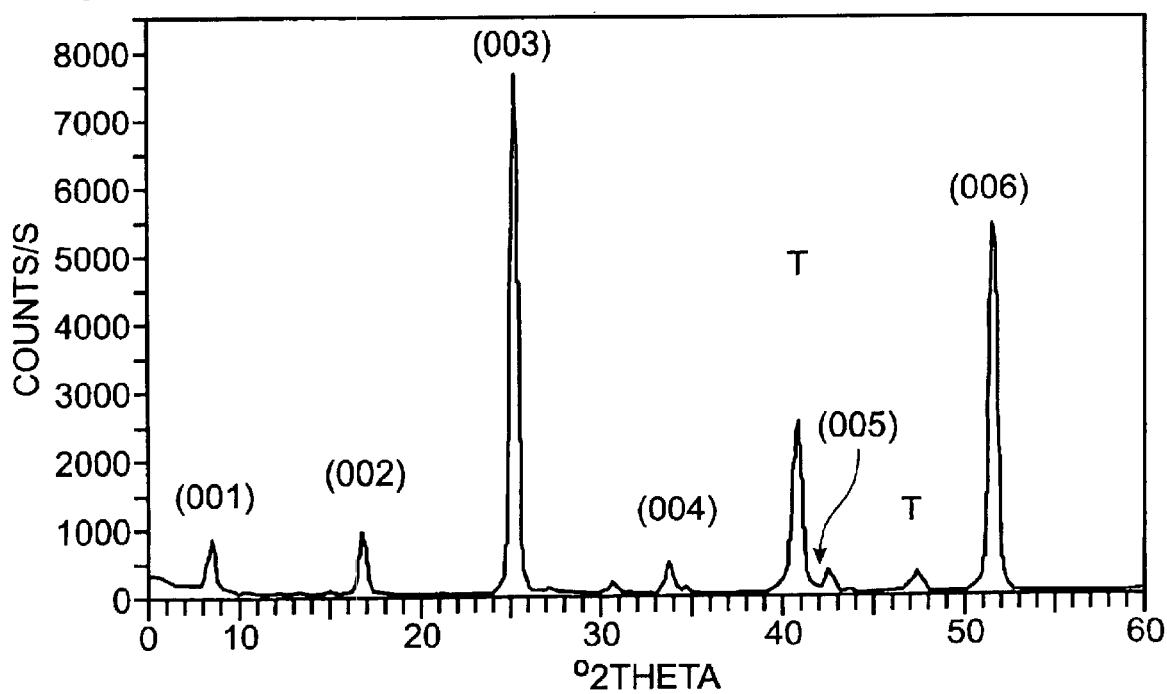
FIG. 3A is a XRD spectrum of a Sn-doped PGO thin film deposited on an Ir substrate.
Figure 3B:
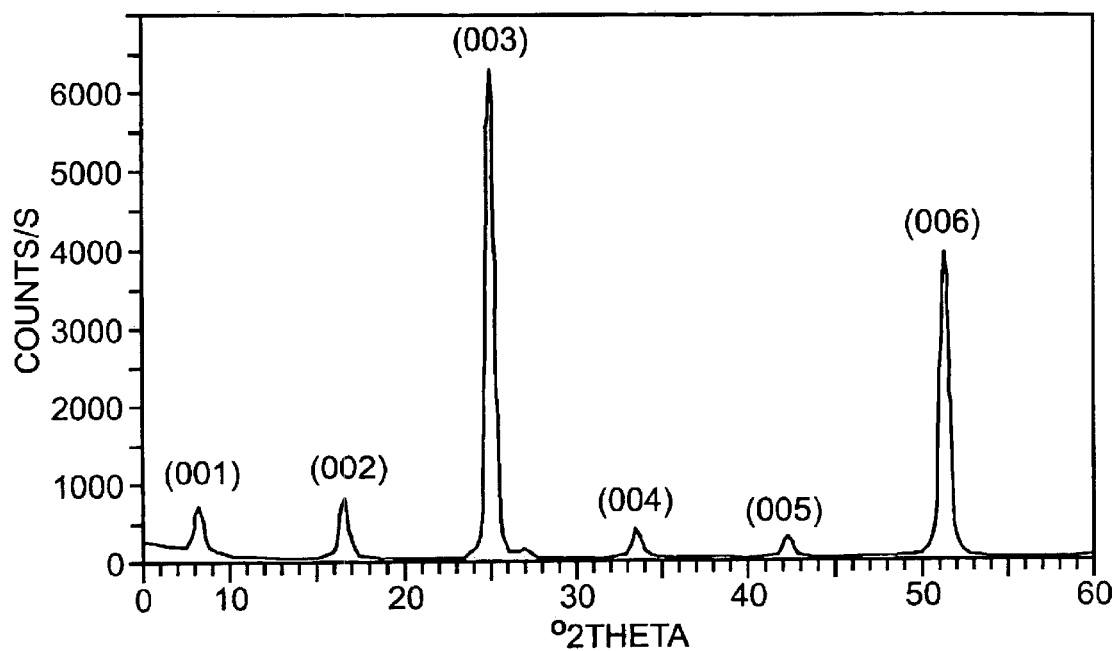
FIG. 3B is a XRD spectrum of a Sn-doped PGO thin film deposited on a $ZrO_2$ substrate.

FIG. 3A is a XRD spectrum of a Sn-doped PGO thin film deposited on an Ir substrate. FIG. 3B is a XRD spectrum of a Sn-doped PGO thin film deposited on a $ZrO_2$ substrate. It can be seen that very pure single-phase c-axis PGO thin film are obtained on both substrates.

Figure 4:
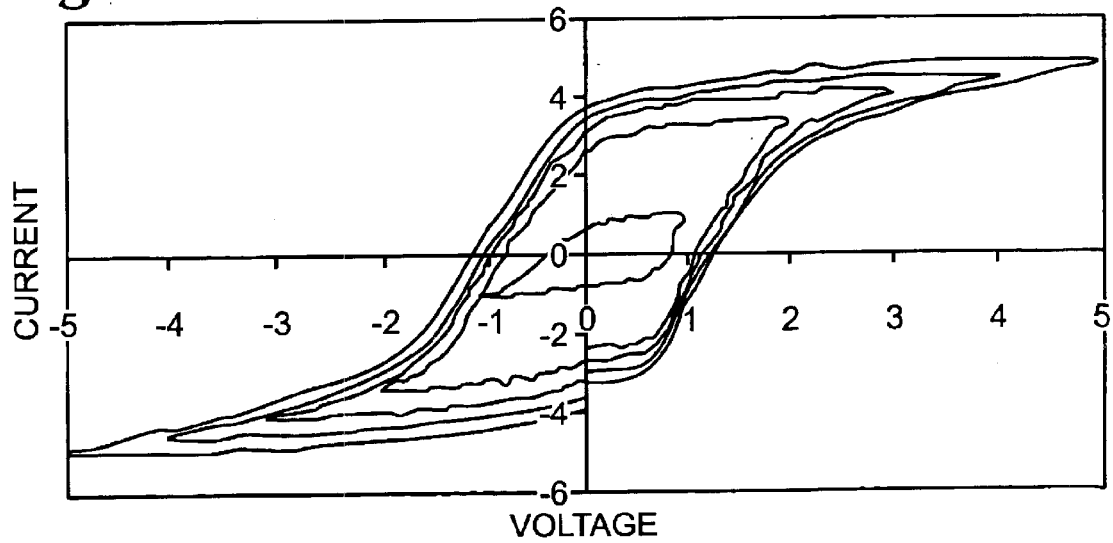
FIG. 4 depicts the hysteresis loop obtained from a Ir/PSGO/Ir capacitor.

FIG. 4 depicts the hysteresis loop obtained from a Ir/PSGO/Ir capacitor. A well-saturated, square shaped, hysteresis loop is obtained. The hysteresis loop is well saturated at 3V, indicating it can be used for low programming device applications. The 2Pr is about 4–8 $\mu$C/cm². The PSGO thin film used in this capacitor was spin coated with precursor having an atomic ratio of Pb:Sn:Ge=5.1:0.4:3.

Figure 5:
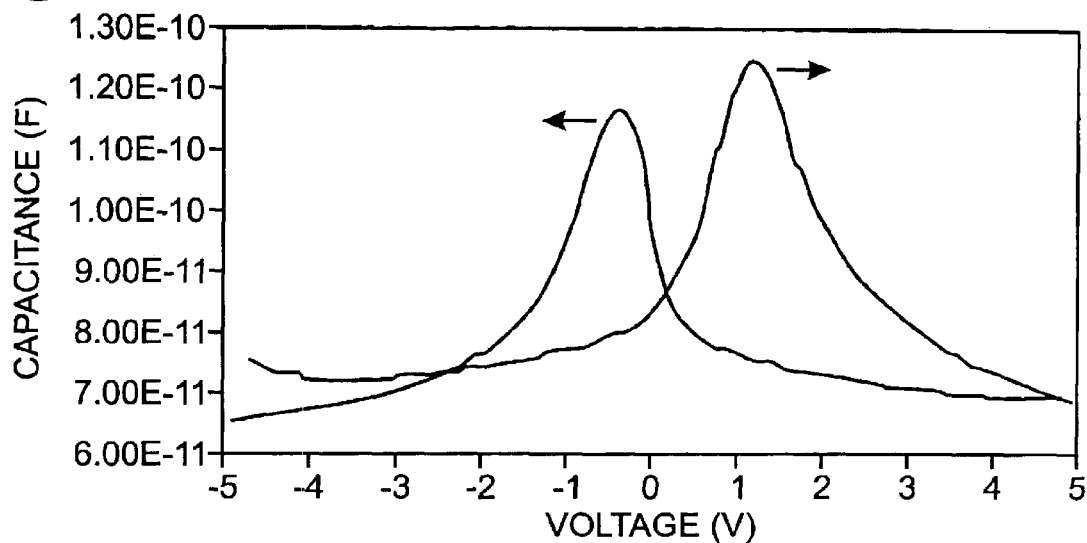
FIG. 5 illustrates the dielectric constant of a PSGO thin film.

FIG. 5 illustrates the dielectric constant of a PSGO thin film. The area of the Ir/PSGO/Ir capacitor is about $5\times10^{-4}$ cm². The thickness of the PGO thin film is about 150 nm. The calculated dielectric constant is about 40–50.

Although the invention has been illustrated using a Sn-doped PGO film, the present invention processing conditions can be also applied to the use of other doping elements. That is, a PMGO film can be formed where M is: Sn, Ba, Sr, Cd, Ca, Pr, Ho, La, Sb, Zr, or Sm, applied using a spin on method. Similar precursor compositions and concentrations, and the processing conditions are used to deposit the PMGO thin film using MOCVD and other CSD (chemical solution deposition) methods.

Figure 6:
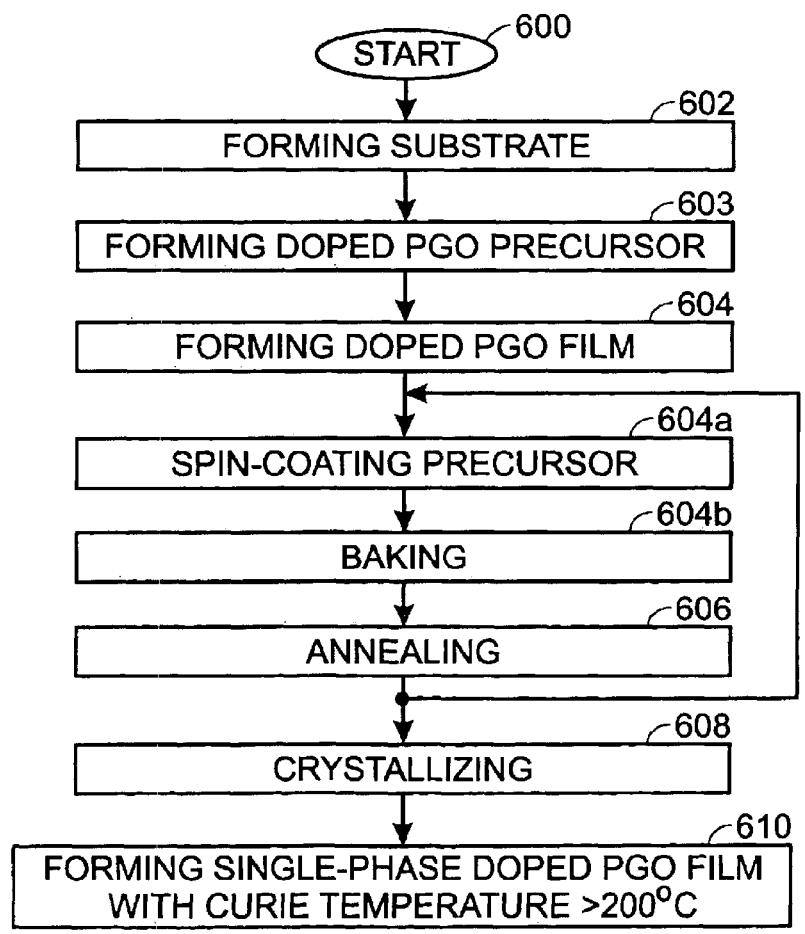
FIG. 6 is a flowchart illustrating the present invention method for forming a doped $Pb_5Ge_3O_{11}$ (PGO) ferroelectric thin film.

FIG. 6 is a flowchart illustrating the present invention method for forming a doped $Pb_5Ge_3O_{11}$ (PGO) ferroelectric thin film. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 forms a substrate. Step 604 forms a doped PGO film overlying the substrate. In one aspect, Step 604 forms a doped PGO film having a thickness in the range of 10 to 300 nanometers (nm). Step 606 anneals. Step 608 crystallizes. Step 610 forms a single-phase c-axis doped PGO thin film overlying the substrate, having a Curie temperature of greater than 200 degrees C.

Forming a substrate in Step 602 includes forming either an electrically conductive or electrically insulating substrate. If Step 602 forms an electrically conductive substrate, the substrate can be a material such as Ir, Pt, Pt/Ir, or Ir—Ta—O. If Step 602 forms an electrically insulating substrate, the substrate can be a material such as $ZrO_2$, $HfO_2$, Zr—Hf—O, Zr—Al—O, or Hf—Al—O.

In some aspects, forming a doped PGO film overlying the substrate in Step 604 includes depositing a doped precursor in the range between 0.1N and 0.5N, with a molecular formula of $Pb_{y-x}M_xGe_3O_{11}$, where:

M is a doping element;

--- y = 4.5 to 6; and,
x = 0.1 to 1.

---

Element M may be Sn, Ba, Sr, Cd, Ca, Pr, Ho, La, Sb, Zr, or Sm.

In some aspects, forming a doped PGO film includes substeps. Step 604A spin coats the precursor at a spin speed in the range between 500 and 10,000 revolution per minute (rpm). Step 604B bakes. More specifically, Step 604B bakes in an air atmosphere; at a temperature in the range between 50 and 450 degrees C.; for a duration in the range between 1 and 30 minutes.

In other aspects, annealing in Step 606 includes rapid thermal annealing (RTA): in an oxygen atmosphere; at a temperature in the range of 450 to 600 degrees C.; for a duration in the range of 1 to 30 minutes. In another aspect, the steps of depositing the precursor (Step 604A), baking (Step 604B), and annealing (Step 606) are iterated a plurality of times.

In a different aspect, crystallizing (Step 608) includes heating the doped PGO film: in an oxygen atmosphere; at a temperature in the range of 500 to 600 degrees C.; for a duration in the range of 15 to 360 minutes.

Using Sn as an example, one aspect of the method comprises a further step. Step 603, prior to forming a Sn-doped PGO film in Step 604, prepares a Sn-doped PGO precursor as follows:

mixing lead acetate trihydrate, germanium isopropoxide, and Sn 2-ethylhexanoic acid in di (ethylene glycol) ethyl ether solution;

heating the mixture to a temperature in the range between 140 and 190 degrees C., for a duration in the range of 1 to 2 hours; and, filtering the mixture through a 0.2 micron filter.

Then, forming a Sn-doped PGO film in Step 604 includes spin-coating a Sn-doped PGO precursor with an atomic ratio of Pb:Sn:Ge=5.1:0.4:3, with a spin speed in the range of 2500 to 4000 rpm. Baking (Step 606) includes baking each layer of deposited precursor at a temperature of 200 degrees C. for 1 to 5 minutes. Annealing (Step 608) includes annealing at a temperature in the range of 450 to 600 degrees C., for a duration of 1 to 30 minutes. The deposition, baking, and annealing steps are performed a total of 5 times. Then, crystallizing (step 608) includes RTA annealing at a temperature in the range of 500 to 600 degrees C., for a duration of 5 to 60 minutes.

A method for depositing a doped PGO thin film, and corresponding doped thin film structures have been described. Examples have been given to illustrate the fabrication process and device characteristic. However, the invention is not limited to merely these examples. The invention is applicable to the formation of doped $Pb_5Ge_3O_{11}$ ferroelectric thin film for use in nonvolatile memory devices, DRAMs, capacitors, pyroelectric infrared sensors, optical displays, optical switches, piezoelectric transducers, and surface acoustic wave devices applications. Other variations and embodiments of the invention will occur to those skilled in the art.

We claim:

1. A method for forming a doped $Pb_5Ge_3O_{11}$ (PGO) ferroelectric thin film, the method comprising:

forming a substrate;

forming a doped PGO film overlying the substrate;

annealing;

crystallizing; and, from the crystallized doped PGO film, forming a single-phase c-axis doped PGO thin film overlying the substrate, having a Curie temperature of greater than 200 degrees C.

2. The method of claim 1 wherein forming a substrate includes forming the substrate from a material selected from the group including electrically conductive and electrically insulating substrates.

3. The method of claim 2 wherein forming an electrically conductive substrate includes forming the substrate from a material selected from the group including Ir, Pt, Pt/Ir, and Ir—Ta—O.

4. The method of claim 2 wherein forming an electrically insulating substrate includes forming the substrate from a material selected from the group including ZrO2, HfO2, Zr—Hf—O, Zr—Al—O, and Hf—Al—O.

5. The method of claim 1 wherein forming a doped PGO film overlying the substrate includes depositing a doped precursor having a molarity in the range between 0.1[[N]] and 0.5[[N]], with a molecular formula of Pby-xMxGe3O11, where:

M is a doping element;

--- y = 4.5 to 6; and,
x = 0.1 to 1.

---

6. The method of claim 5 wherein depositing a doped PGO precursor includes dept cursor doped with an element M selected from the group including, Ba, Sr, Cd, Ca, Pr, Ho, La, Sb, Zr, and Sm.

7. The method of claim 6 wherein forming a doped PGO film includes:

spin-coating the precursor at a spin speed in the range between 500 and 10,000 revolution per minute (rpm); and, baking.

8. The method of claim 7 wherein baking includes baking:

in an air atmosphere;

at a temperature in the range between 50 and 450 degrees C.; and, for a duration in the range between 1 and 30 minutes.

9. The method of claim 8 wherein annealing includes rapid thermal annealing (RTA):

in an oxygen atmosphere;

at a temperature in the range of 450 to 600 degrees C.; and, for a duration in the range of 1 to 30 minutes.

10. The method of claim 9 wherein the steps of depositing the precursor, baking, and annealing are iterated a plurality of times.

11. The method of claim 9 wherein crystallizing includes heating the doped PGO film:

in an oxygen atmosphere;

at a temperature in the range of 500 to 600 degrees C.; and, for a duration in the range of 15 to 360 minutes.

12. The method of claim 1 wherein forming a single-phase c-axis doped PGO thin film overlying the substrate includes forming a doped PGO film having a thickness in the range of 10 to 300 nanometers (nm).

13. The method of claim 6 further comprising:

prior to forming a Sn-doped PGO film, preparing a Sn-doped PGO precursor as follows:

mixing lead acetate trihydrate, germanium isopropoxide, and Sn 2-ethylhexanoic acid in di (ethylene glycol) ethyl ether solution;

heating the mixture to a temperature in the range between 140 and 190 degrees C., for a duration in the range of 1 to 2 hours; and, filtering the mixture through a 0.2 micron filter.

14. The method of claim 13 wherein forming a Sn-doped PGO film includes spin-coating a Sn-doped PGO precursor with an atomic ratio of Pb:Sn:Ge=5.1:0.4:3, with a spin speed in the range of 2500 to 4000 rpm;

wherein baking includes baking each layer of deposited precursor at a temperature of 200 degrees C. for 1 to 5 minutes;

wherein annealing includes annealing at a temperature in the range of 450 to 600 degrees C., for a duration of 1 to 30 minutes;

wherein the deposition, baking, and annealing steps are performed a total of 5 times; and, wherein crystallizing includes RTA annealing at a temperature in the range of 500 to 600 degrees C., for a duration of 5 to 60 minutes.

\* \* \* \* \*